United States Patent
Kozlowski et al.

(10) Patent No.: US 8,555,325 B2
(45) Date of Patent: Oct. 8, 2013

(54) SYSTEMS, METHODS AND APPARATUS FOR TESTING A DATA CONNECTION PROVIDED OVER A POWER SUPPLY LINE

(75) Inventors: Anthony Kozlowski, Monument, CO (US); David Belt, Morrison, CO (US); Benjamin Cooke, Denver, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 1562 days.

(21) Appl. No.: 12/040,471

(22) Filed: Feb. 29, 2008

(65) Prior Publication Data

US 2009/0219824 A1 Sep. 3, 2009

(51) Int. Cl.
*H04N 7/173* (2011.01)

(52) U.S. Cl.
USPC .......... 725/107; 348/192; 348/193; 370/245; 370/248; 370/250; 370/252; 370/253; 702/57; 702/58; 702/59; 702/60; 702/61; 702/62; 702/64; 702/65; 702/66; 702/67; 702/68; 702/69; 702/121

(58) Field of Classification Search
USPC ............... 725/107; 348/192–193; 370/245, 370/248, 250, 252–253; 702/57–62, 64–69, 702/121
See application file for complete search history.

(56) References Cited

U.S. PATENT DOCUMENTS

| | | | | |
|---|---|---|---|---|
| 5,812,557 | A * | 9/1998 | Stewart et al. | 714/712 |
| 8,031,758 | B2 * | 10/2011 | Dawson et al. | 375/222 |
| 2006/0176044 | A1 * | 8/2006 | Binder et al. | 324/71.1 |
| 2006/0235552 | A1 * | 10/2006 | Manis et al. | 700/94 |
| 2007/0179718 | A1 * | 8/2007 | Hyacinthe et al. | 702/57 |
| 2008/0013612 | A1 * | 1/2008 | Miller et al. | 375/224 |
| 2008/0055067 | A1 * | 3/2008 | Curt et al. | 340/538.12 |
| 2008/0190639 | A1 * | 8/2008 | Baran et al. | 174/50 |
| 2008/0266077 | A1 * | 10/2008 | Cagno et al. | 340/538.11 |

OTHER PUBLICATIONS

Signal to noise ration, Free Online Encyclopedia, http://encyclopedia2.thefreedictionary.com/Signal+to+noise+ratio, All pages.*
Signal-to-Noise ration (S/N or SNR), http://searchnetworking.techtarget.com/definition/signal-to-noise-ratio, All Pages.*
Barnard, Patrick, Asoka Unveils New BPL Network Testing Tools at CES 2008, TMCnet, Jan. 9, 2008, http://www.tmcnet.com/ce/articles/18016-asoka-unveills-new-bpl-network-testing-tools-ces.htm (accessed on Mar. 20, 2008).

* cited by examiner

*Primary Examiner* — Jason Salce
(74) *Attorney, Agent, or Firm* — Seed IP Law Group PLLC

(57) ABSTRACT

Systems, methods and apparatus are described for testing a data connection provided over a power supply line. A testing apparatus is coupled to a socket of the power supply line. The AC power supply line communicatively couples the testing apparatus to a communication device or another testing apparatus. The testing apparatus identifies the signal strengths of signals received by the testing apparatus and identifies the signal strengths of signals received by the communication device. The testing apparatus outputs an indicator of the first signal strength and the second signal strength to a user and this information may be utilized to detect noise or other problems in the data connection provided over the AC power supply line.

20 Claims, 3 Drawing Sheets

SYSTEMS, METHODS AND APPARATUS FOR TESTING A DATA CONNECTION PROVIDED OVER A POWER SUPPLY LINE

BACKGROUND

With the increasing number of communication capable devices utilized by consumers, data networks in the home and other structures have become more of a necessity rather than a luxury. However, it is often cost prohibitive to utilize traditional network wiring, such as cat5 wiring, to provide local area networks within a home. Solutions, such as HomePlug®, have been developed that provide data connections over alternating-current (AC) wiring within a structure. Two or more HomePlug® compatible devices are plugged into sockets of the AC wiring of the structure, and each device modulates signals that are propagated to the other devices of the network over the AC wiring.

Because the AC wiring of the structure is not designed for carrying data, users are often confronted with problems when establishing data connections between two or more electrical sockets. For example, there may be noise, present in the AC wiring near one of the sockets that interferes with the strength of a signal received by a HomePlug® device coupled to the socket. Noise may be caused by any number of sources or devices coupled to the AC wiring of the structure, and noise may adversely affect the data transfer rate between two or more HomePlug® devices. Thus, not every socket in a structure is appropriate for utilization in a HomePlug® network. However, it is a problem for a user to accurately identify which sockets are appropriate for utilization in a HomePlug® network. In other words, it is problematic for a user to identify the sockets that provide less than adequate data transfer rates for HomePlug® networks.

BRIEF DESCRIPTION OF THE DRAWINGS

The same number represents the same element or same type of element in all drawings.

DETAILED DESCRIPTION

The various embodiments described herein generally provide apparatus, systems and methods which facilitate the detection of communication problems in data networks provided over power wiring of a structure. More particularly, signal strengths of two or more receiving devices may be utilized to identify sockets that are suitable or unsuitable for utilization in establishing network nodes for a data communication network. In at least one embodiment, a stand-alone testing apparatus is utilized to identify and present to a user the relative signal strengths at two or more network nodes. In some embodiments, the stand-alone testing apparatus may be hand-held and portable such that an installer may carry the testing apparatus into a structure during an equipment installation. In short, the various embodiments described herein provide systems, methods and apparatus for testing the quality and/or data transfer rates of data communication networks provided over AC wiring in a structure.

Figure 1:
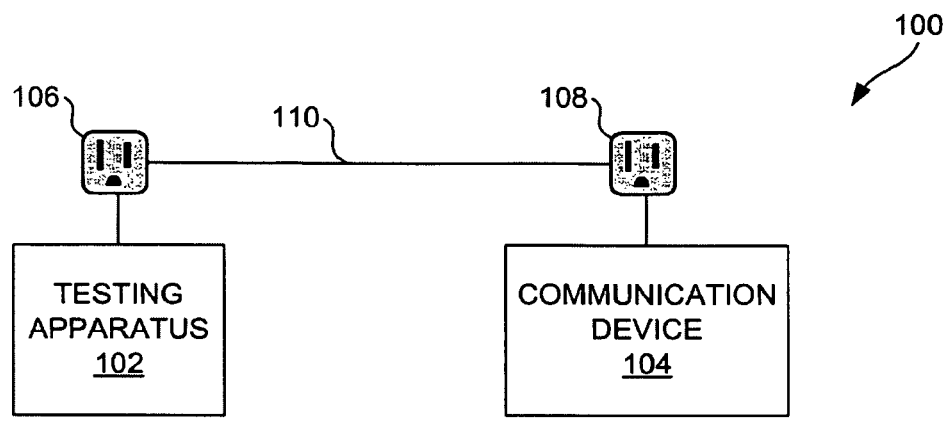
FIG. 1 illustrates an embodiment of a communication network.

FIG. 1 illustrates an embodiment of a communication network 100. More particularly, the communication network 100 is provided over electrical power line wiring of a structure. The communication network 100 includes a testing apparatus 102, a communication device 104, a first socket 106, a second socket 108 and a power supply line 110. Each of these components will be discussed in greater detail below. Further, the communication network 100 may include other components, elements or devices not illustrated for the sake of brevity.

The testing apparatus 102 is utilized to test and/or debug communication problems in the communication network 100. The testing apparatus 102 is coupled to the first socket 106 of the power supply line 110. In at least one embodiment, the testing apparatus 102 includes one or more prongs that are inserted into the first socket 106. While the first socket 106 is illustrated as a three-prong AC socket, it is to be appreciated that the testing apparatus 102 and the first socket 106 may be communicatively coupled through any type of electrical prong configuration.

When connected to the communication network 100, the testing apparatus 102 identifies other devices of the communication network 100, such as communication device 104. More particularly, the testing apparatus 102 includes a receiver that receives and identifies radio frequency (RF) signals modulated onto the power supply line 110 from other devices of the communication network 100. In at least one embodiment, the identity of these devices may be stored in a table of memory of the testing apparatus 102. The testing apparatus 102 may further identify the signal strength of signals received from the other communication devices of the communication network 100. If there are no other devices presently coupled to the communication network 100, or if there is interference which prohibits the testing apparatus 102 from receiving signals from other devices of the communication network 100, then the testing apparatus 102 identifies that no signal is presently being received by the testing apparatus 102.

The communication device 104 is communicatively coupled to the communication network 100 through the second socket 108. The communication device 104 may comprise any type of device configured to communicate over the communication network 100. More particularly, the communication device 104 may comprise any type of device configured to modulate RF signals onto the power supply line 110 to communicate with other connected devices of the communication network 100. The communication device 104 also identifies other devices of the communication network 100 as well as the strength of signals received from these other devices of the communication network 100.

In at least one embodiment, the communication device 104 is another testing apparatus. Thus, the communication network 100 may include multiple testing apparatuses 102 that are utilized to debug communication problems within the communication network 100. In at least one embodiment, the communication device 104 is a television receiver, such as a satellite television receiver, over-the-air television receiver, cable television receiver and the like.

As new devices are coupled to the communication network 100, these devices transmit messages across the communication network 100 to notify other devices of their presence on the communication network 100. The testing apparatus 102 and the communication device 104 may thus be capable of identifying any type of device coupled to the communication network 100. In at least one embodiment, the testing apparatus 102 and the communication device 104 are configured to exchange the strengths of their received signals. For example, the signal strengths may be exchanged between the testing apparatus 102 and the communication device 104 during a discovery process if each device is configured to transmit its signal strength to other devices. Thus, the testing apparatus 102 may not receive signal strength information from some devices of the communication network 100 which are not configured to provide such information to the testing apparatus 102 (and/or other devices of the communication network 100). For example, the communication network 100 may include the testing apparatus 102, the communication device 104 (which is a television receiver in one embodiment), and a personal computer. However, the testing apparatus 102 and the communication device 104 may be configured to transmit their received signal strengths to other devices, and the personal computer may not be configured to transmit such information to other devices. Thus, an indicator provided by the testing apparatus 102 regarding the quality or strength of signals received at a remote device is generated based upon information received from devices configured to cooperatively operate with the testing apparatus 102. In some embodiments, the signal strengths may be exchanged responsive to queries from the testing apparatus 102 and/or the communication device 104.

The testing apparatus 102 then outputs indicators to a user based on the received signal strengths of both the testing apparatus 102 and the communication device 104. In at least one embodiment, the testing apparatus 102 includes one or more blinking lights that indicate the signal strengths received by the testing apparatus 102 and the communication device 104. For example, the signal strengths may be indicated by flashing the blinking lights at different rates to indicate the quality of the data connection. More particularly, no blinking light may indicate "no connection", a slow blinking rate may indicate a "poor connection", a high blinking rate may indicate a "good connection" and a solid light may indicate an "excellent connection".

It is to be appreciated that the quality of the connection may be determined by comparing the signal strengths with predetermined thresholds. In at least one embodiment, the blinking lights are correlated with particular data transfers rates. This is because the data transfer rate is typically dependent on the noise seen by a device (e.g., the testing apparatus 102). For example, in one embodiment, 0 Mbps indicates "no connection", 0-4 Mbps indicates a "poor connection", 4-8 Mbps indicates a "good connection" and 9-12 Mbps indicates an "excellent connection". While particular data transfer rates have been described herein, it is to be appreciated that any data rates may correlate with particular indicators depending on desired design criteria.

A user utilizes the testing apparatus 102 to debug problems on the communication network 100. As described above, the testing apparatus 102 may include two blinking lights that each indicate the quality of the data connection at a particular socket 106 and/or 108. For example, a first blinking light of the testing apparatus 102 that indicates the quality of the connection at the first socket 106 may be blinking fast (indicating a "good connection" at the testing apparatus 102). Additionally, a second blinking light of the testing apparatus 102 that indicates the quality of the connection at the second socket 108 may be blinking slow (indicating a "poor connection" at the communication device 104). Thus, the user is notified that there is too much noise at the communication device 104, and that the user should move the communication device 104 to a different socket to achieve a better data transfer rate.

Similarly, one blinking light may indicate that the testing apparatus 102 should be moved to a different socket to achieve a higher data transfer rate. If one of the blinking lights is unlit, then the user is notified of the need to move one or more of the testing apparatus 102 and/or communication device 104 to a different socket in order to achieve a data connection between the two devices. If both lights on the testing apparatus 102 are blinking fast and/or continuously lit, then the user will know that the data connection between the testing apparatus 102 and the communication device 104 is adequate for data transfer between the devices. In other embodiments, the testing apparatus 102 may include an integrated display, speaker and/or any other type of output device for communicating to a user the quality of a data connection between the testing apparatus 102 and/or the communication device 104. While the testing apparatus 102 has been described as providing two indicators, one for a local signal strength and one for a remote signal strength, it is to be appreciated that any number of indicators may be utilized depending on a desired number of nodes that a testing apparatus 102 is configured to analyze.

Figure 2:
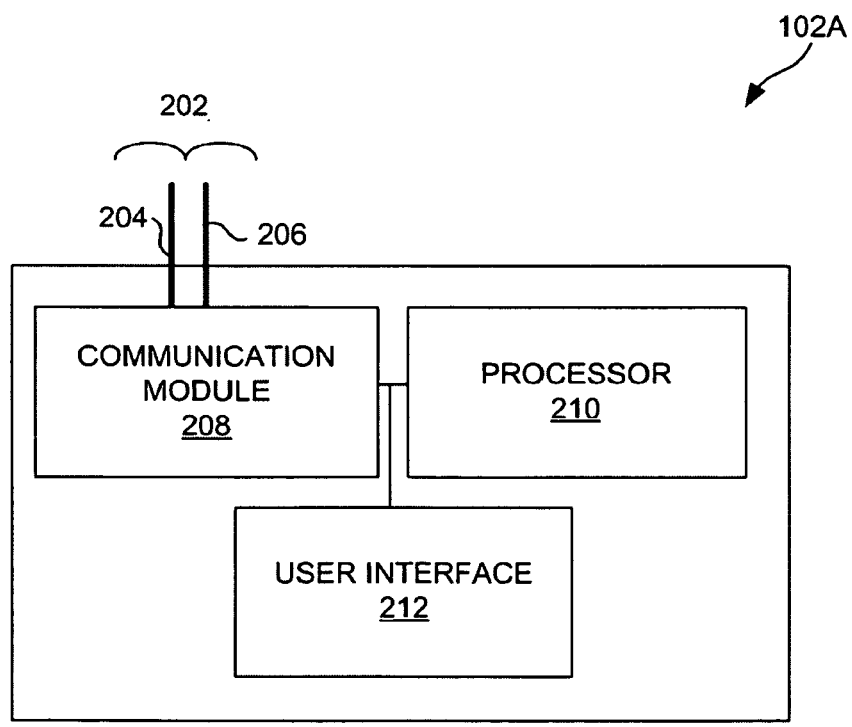
FIG. 2 illustrates an embodiment of a testing apparatus of FIG. 1.

FIG. 2 illustrates an embodiment of a testing apparatus 102A of FIG. 1. FIG. 2 will be discussed in reference to the communication network 100 of FIG. 1. The testing apparatus 102A includes an electrical connector 202 having two prongs 204 and 206, a communication module 208, a processor 210 and a user interface 212. Each of these components will be discussed in greater detail below. Further, the testing apparatus 102A may include other components, elements or devices not illustrated for the sake of brevity.

The electrical connector 202 includes a plurality of prongs 204 and 206 that couple to the first socket 106 (see FIG. 1). More particularly, the prongs 204 and 206 receive electrical current from the first socket 106 that powers the testing apparatus 102A. At the same time, the prongs 204 and 206 communicatively couple to the communication network 100 (see FIG. 1) through the first socket 106. While the testing apparatus 102A is illustrated as having two prongs 204 and 206, it is to be appreciated that any number of prongs in any type of configuration may be utilized.

The communication module 208 is configured to receive/transmit data with other devices of the communication network 100 (see FIG. 1). The communication module 208 modulates data into an RF signal for transmission to other devices (e.g., communication device 104 (see FIG. 1)) and receives similar RF signals from the communication device 104. The communication module 208 is further configured to translate these signals into data appropriate for use by the processor 210. The communication module 208 may communicate with other devices of the communication network 100 using any type of protocol appropriate for transmitting data through the power line supply 110. In at least one embodiment, the communication module 208 utilizes the HomePlug® protocol to communicate data over the communication network 100 (see FIG. 1). In other embodiments, the communication module 208 may utilize other protocols, such as DS2.

The processor 210 is operable for controlling the operation of the testing apparatus 102A. For example, the processor 210 may identify a first signal strength of signals received by the communication module 208 from other devices of the communication network 100 (see FIG. 1). The communication module 208 may determine the signal strengths when identifying other devices of the communication network 100 and/or when receiving data from other devices of the communication network 100 (see FIG. 1).

In at least one embodiment, the communication module 208 receives a second signal strength from the communication device 104 (see FIG. 1). The second signal strength indicates the strength of signals received by the communication device 104 from other devices of the communication network 100 (see FIG. 1). The processor 210 utilizes the signal strengths to output through the user interface 212 the quality of the data connections at the first socket 106 and the second socket 108. In at least one embodiment, the processor 210 may output indicators of the first and second signals strengths responsive to the electrical connector 210 coupling to the power supply line 110.

The user interface 212 may comprise any type of interface for presenting information to a user regarding the signal strengths at the first socket 106 and the second socket 108. The indicators may be audible and/or visible. Exemplary user interfaces 212 include blinking light emitting diodes (LEDs), an LED light bar, display screens, a projection onto a wall or other device, an output to a television or computer screen, speakers and the like.

The user interface 212 may output any type of indicator to the user regarding the first and second signal strengths. In at least one embodiment, the user interface 212 displays an on/off light to indicate the presence or absence of detected signals at either of the first socket 106 or the second socket 108 (see FIG. 1). In some embodiments, the processor 208 may quantify data transfer rates at the first socket 106 and/or the second socket 108 (see FIG. 1) based upon the signal strengths and output the quantified data transfer rates through the user interface 212. As described above, the user interface 212 may indicate the data transfer rates at the first socket 106 and/or the second socket 108 (see FIG. 1) using lights blinking at various speeds that are correlated with the data transfer rates. In some embodiments, the user interface 212 may be a display screen that outputs a numerical, symbol or character based representation of the signal strengths or data transfer rates derived therefrom. In at least one embodiment, the measurements and representations of the signal strengths include measurements of noise, such as amplitude and/or pulse width. In other embodiments, the measurements and representations may include measurements of signal amplitude or pulse width.

Thus, a user may utilize the output of the user interface 212 to detect problems within the communication network 100 (see FIG. 1) and strategically move the testing apparatus 102A and/or the communication device 104 to select the optimal locations within the structure for achieving a desired data transfer rate. Once the user identifies socket locations for achieving a desired data transfer rate, then the testing apparatus 102A may be replaced by another device that communicates with the communication device 104 over the communication network 100. In other words, the user removes the testing apparatus 102A and plugs another HomePlug® device into the first socket 106. For example, the testing apparatus 102A may be replaced by a HomePlug® modem that communicatively couples to a telephone line near the first socket 106. Thus, the chosen locations may be selected based on additional criteria besides the data transfer rate at a particular socket, such as the availability of nearby devices or connections that are utilized by a HomePlug® device.

Likewise, if the communication device 104 (see FIG. 1) initially comprises another testing apparatus 102, then the communication device 104 may be replaced in the communication network 100 with a desired HomePlug® device, such as a HomePlug® enabled television receiver. Using the testing apparatus 102A, the user may identify desirable locations for two HomePlug® devices, such as a modem and a satellite television receiver. Further, using the testing apparatus 102A, the user may debug problem sockets which are not desirable for utilization in the communication network 100 (see FIG. 1).

Those of ordinary skill in the art will appreciate that the various functional elements 208 through 212 shown as operable within the testing apparatus 102A may be combined into fewer discrete elements or may be broken up into a larger number of discrete functional elements as a matter of design choice. Thus, the particular functional decomposition suggested by FIG. 2 is intended merely as exemplary of one possible functional decomposition of elements within the testing apparatus 102A.

In another embodiment, testing of the data connection provided over the communication network 100 may be performed by the communication device 104 of FIG. 1. More particularly, the communication device 104 of FIG. 1 may be embodied as a television receiver. The television receiver may be external to an associated television or display device. For example, the television receiver may be a cable television, satellite television, video over internet protocol (IP) or over-the-air television receiver set-top box that provides an output signal to a communicatively coupled television or display device. In other embodiments, the television receiver may be receiver that is integrated with a television or display device.

Figure 3:
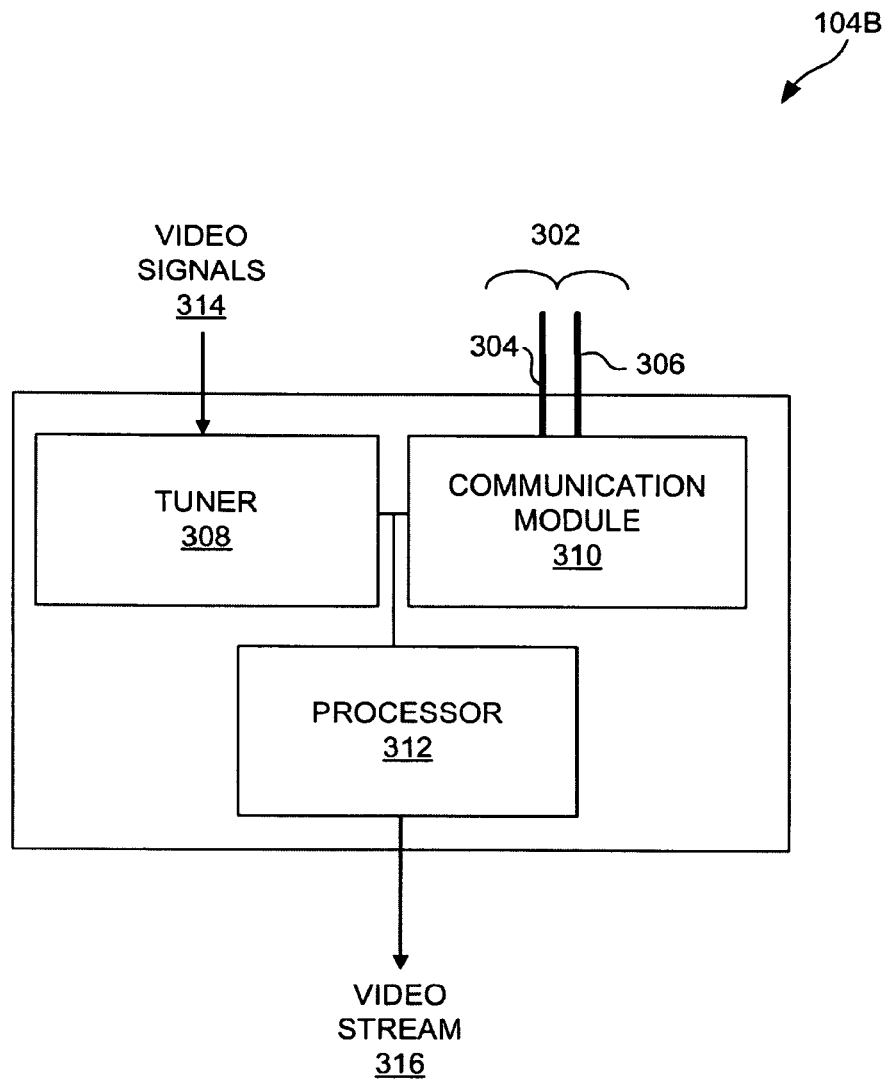
FIG. 3 illustrates an embodiment of a television receiver.

FIG. 3 illustrates an embodiment of a television receiver 104B. FIG. 3 will be discussed in reference to the communication network 100 of FIG. 1. The television receiver 104B includes a power plug 302 having first and second prongs 304 and 306, a tuner 308, a communication module 310 and a processor 312. Each of these components will be discussed in greater detail below. The television receiver 104B may include other components, elements or devices not illustrated for the sake of brevity.

The power plug 302 includes a plurality of prongs 304 and 306 for coupling to the second socket 108 (see FIG. 1). More particularly, the prongs 304 and 306 receive electrical current from the first socket 106 that powers the television receiver 104B. At the same time, the prongs 304 and 306 communicatively couple to the communication network 100 (see FIG. 1) through the second socket 108. While the television receiver 104B is illustrated as having two prongs 304 and 306, it is to be appreciated that any number of prongs in any type of configuration may be utilized.

The tuner 308 is operable for receiving video signals 314 from a content source. The tuner 308 may be operable for receiving and tuning any type of video signals 314. For example, the tuner 308 may receive an over-the-air broadcast signal, a direct broadcast satellite signal, a cable television signal or an internet television signal. In some embodiments, the tuner 308 may receive content from internal or external devices, such as video servers, digital video recorders (DVRs), digital video disk (DVD) players and the like that are communicatively coupled to the television receiver 104B over the communication network 100 and/or other types of networks or connections.

The communication module 310 is configured to receive/transmit data with other devices of the communication network 100 (see FIG. 1). The communication module 310 modulates data into an RF signal for transmission to other devices (e.g., the testing apparatus 102 or a HomePlug® modem or Ethernet adapter (see FIG. 1)) and receives similar RF signals from the other device. The communication module 310 is further configured to translate these signals into data appropriate for use by the processor 312. The communication module 310 may communicate with other devices of the communication network 100 (see FIG. 1) using any type of protocol appropriate for transmitting data through the power line supply 110. In at least one embodiment, the communication module 310 utilizes the HomePlug® protocol to communicate data over the communication network 100 (see FIG. 1).

The processor 312 is operable for controlling the operation of the television receiver 104B. In at least one embodiment, the processor 312 receives the video signals 314 and responsively generates an output stream 316 for presentation on a display device. The processor 210 is further operable to identify a first signal strength of signals received by the communication module 310 from other devices of the communication network 100 (see FIG. 1). The communication module 310 may determine the various signal strengths when identifying other devices of the communication network 100 (see FIG. 1) and/or when receiving data from other devices of the communication network 100.

The communication module 310 receives a second signal strength from the testing apparatus 102 (see FIG. 1) or other devices communicatively coupled to the communication network 100. The second signal strength indicates the strength of signals received by the testing apparatus 102 (see FIG. 1) from other devices of the communication network 100 (see FIG. 1), such as the television receiver 104B. The processor 312 utilizes the signal strengths to output through the video stream 316 the quality of the data connections at the first socket 106 and the second socket 108.

For example, the processor 312 may output indicators of the first and second signals strengths for presentation on a display device responsive to a user initiating a testing function on the television receiver 104B. In some embodiments, the processor 312 may quantify first and second data rates at the first and second sockets 106 and 108 based on the two signal strengths and output these data rates through the video stream 316 for presentation on the display device. Thus, a user may locate problems within the communication network 100 and select appropriate sockets for locating the television receiver 104B as well as other communication devices of the communication network 100 (see FIG. 1), such as HomePlug® modems or Ethernet adapters.

Some television receivers 104B (see FIG. 1), such as satellite television receivers, are often hooked to a telephone line in order to provide a backchannel between the television receiver 104B and the satellite television provider. The backchannel communicates various data, such as pay-per-view ordering information, health and diagnostics, information, demographic information and the like. Because a telephone jack is not always available in the vicinity of the television receiver 104B, the communication network 100 may be utilized to create a connection between the television receiver 104B located at the second socket 108 and a HomePlug® modem located at the first socket 106. The HomePlug® modem connects to a phone jack, allowing the television receiver 104B to communicate with the television provider over a telephone network. The testing functionality of the television receiver 104B and/or the testing functionality of the testing apparatus 102 (see FIG. 1) allows a user to select appropriate first and second sockets 106 and 108 for establishing a data connection with a desired data transfer rate. Further, the testing functionality of the testing apparatus 102 and/or the television receiver 104B allow a user to quickly identify sockets which provide no connectivity to the communication network 100 (see FIG. 1) because of too much noise, interference, bad connections and other problems which may not be apparent to a user.

Those of ordinary skill in the art will appreciate that the various functional elements 308 through 312 shown as operable within the television receiver 104B may be combined into fewer discrete elements or may be broken up into a larger number of discrete functional elements as a matter of design choice. Thus, the particular functional decomposition suggested by FIG. 3 is intended merely as exemplary of one possible functional decomposition of elements within the television receiver 104B.

Figure 4:
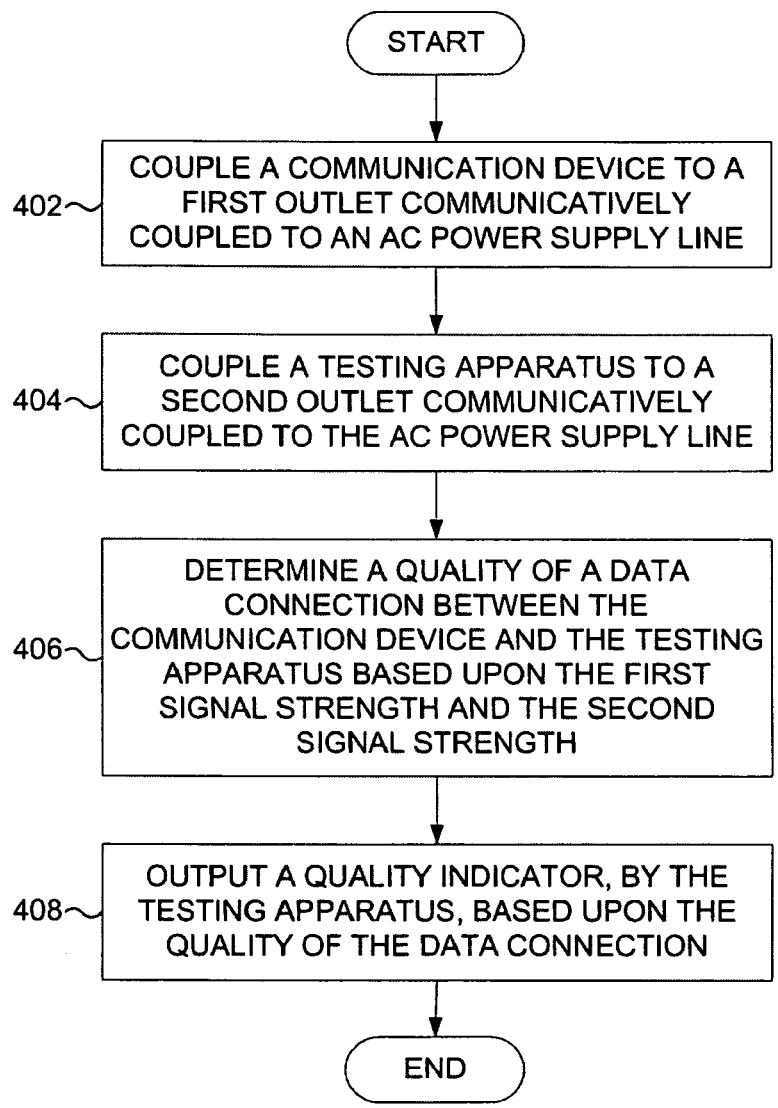
FIG. 4 illustrates an embodiment of a process for testing the quality of a data connection between two devices communicatively coupled over an AC power supply line.

FIG. 4 illustrates an embodiment of a process for testing the quality of a data connection between two devices communicatively coupled over an AC power supply line. It is to be appreciated that the process of FIG. 4 may be applied to test any type of communication network provided over any type of AC power supply line. The operations of FIG. 4 may not be all-inclusive, and may include other operations not illustrated for the sake of brevity.

The process includes coupling a communication device to a first socket communicatively coupled to an AC power supply line (operation 402). The communication device may be any type of device adapted to communicate over a data network provided over an AC power supply line. Exemplary devices includes a testing apparatus, a television receiver, a HomePlug® to telephone converter modem and a HomePlug® to Ethernet converter.

The process further includes coupling a testing apparatus to a second socket communicatively coupled to the AC power supply line (operation 404). The testing apparatus to identify a first signal strength of signals received by the communication device through the AC power supply line and further identifies a second signal strength of signals received by the testing apparatus through the AC power supply line. In at least one embodiment, the first signal strength is received by the testing apparatus through a transmission originating from the communication device.

The process further includes determining a quality of a data connection between the communication device and the testing apparatus based upon the first signal strength and the second signal strength (operation 406). In at least one embodiment, determining the quality of the data connection may include quantifying a first data rate of the first socket based upon the first signal strength and quantifying a second data rate of the second socket based upon the second signal strength. Quantifying of the data rates at various sockets of a communication network based upon identified signal strengths is described above in reference to FIG. 1.

The process further includes outputting a quality indicator, by the testing apparatus, based upon the quality of the data connection (operation 408). In at least one embodiment, outputting the quality indicator may include outputting indicators of the first and second data rates through the testing apparatus. The quality indicators and/or the data rates may be outputted though any type indicators, including visual indicators and/or audible indicators.

After operation 408, a user may take corrective steps to effectuate a better data connection between the testing apparatus and the communication device based upon the quality indicators outputted by the testing apparatus. For example, the user may determine that the first data rate (at the first socket) is below a threshold value. If the testing apparatus outputs indicators of "no connection", "poor connection", "good connection" and "excellent connection", then the user may determine that there is "no connection" or a "poor connection". The user then removes the communication device from the first socket and moves the communication device to a third socket.

The process of FIG. 4 may then be repeated to quantify a third data rate of the third socket based upon a new strength of signals received by the communication device at the third socket. The testing apparatus then outputs new indicators to the user, and the user determines whether the data transfer rate at the third socket is below the threshold value. If the data transfer rate is acceptable, then the user may replace the testing apparatus at the second socket with another communication device, such as a HomePlug® modem or Ethernet adapter. If the data transfer rate at the third socket is unacceptable, then the user may again move the communication device to another socket until a node within the communication network is located that has an acceptable data transfer rate. In some situations, after utilizing the testing apparatus, a user may determine that every socket in a structure is unsuitable for utilization with HomePlug® technology, and thus, may be unable to establish a HomePlug® communication network in the structure.

Similarly, the testing apparatus may indicate that the data transfer rate at the second socket is unacceptable as being below a threshold value. Likewise, the user may move the testing apparatus to a different socket and repeat the method of FIG. 4 to determine whether the newly selected socket provides a better data transfer rate than the second socket. Once an appropriate socket is located for the testing apparatus, then the testing apparatus may be replaced with another desired communication device.

The indicators provided by the testing apparatus allow a user to quickly determine which socket in a pair of nodes is problematic. Thus, the user may move one of the two connected devices to a different socket in an attempt to locate a socket that provides an acceptable data connection to the communication network provided over the power supply line. Ultimately, the communication network is utilized with at least two communication devices, such as a HomePlug® modem and a HomePlug® enabled television receiver. To perform the testing operations of FIG. 4, the user may utilize one of the desired communication devices in combination with a testing apparatus or may utilize two different testing apparatuses. This provides flexibility to an installer to choose which devices to utilize during the testing process, such as when the location of one device, such as a television receiver, is influenced by desired design criteria of the communication network, such as the location of a television.

Although specific embodiments were described herein, the scope of the invention is not limited to those specific embodiments. The scope of the invention is defined by the following claims and any equivalents therein.

What is claimed:

1. A testing apparatus comprising:
   an electrical connector that is connectable to a first socket of an alternating-current (AC) power supply line;
   a communication module coupled to the electrical connector and configured to receive data through the AC power supply line from a communication device communicatively coupled to a second socket of the AC power supply line, the data including a first signal strength of first signals received by the communication device at the second socket through the AC power supply line;
   a processor communicatively coupled to the communication module configured to identify a second signal strength of second signals received by the communication module at the first socket and to quantify a first data rate at the first socket based upon the second signal strength; and
   a user interface communicatively coupled to the processor and configured to output a first indicator regarding the first signal strength and a second indicator regarding the second signal strength.

2. The testing apparatus of claim 1, wherein the user interface outputs the first and second indicators responsive to the electrical connector coupling to the AC power supply line.

3. The testing apparatus of claim 1, wherein:
   the processor quantifies a second data rate at the second socket based upon the first signal strength; and
   the user interface outputs the first data rate through the second indicator and outputs the second data rate through the first indicator.

4. The testing apparatus of claim 3, wherein the user interface comprises at least one blinking light.

5. The testing apparatus of claim 3, wherein the user interface comprises a display screen.

6. The testing apparatus of claim 1, wherein the communication device comprises a second testing apparatus.

7. The testing apparatus of claim 1, wherein the communication device comprises a television receiver.

8. A television receiver comprising:
   a power plug that couples to a first socket of an alternating-current (AC) power supply line;
   a tuner that receives video signals from a content source;
   a processor communicatively coupled to the tuner that outputs a video stream generated based on the received video signals for presentation by a display device; and
   a communication module coupled to the power plug and communicatively coupled to the processor and configured to communicate data with a testing apparatus coupled to a second socket of the AC power supply line, the communication module identifying a first signal strength of signals received by the communication module through the first socket and transmitting the first signal strength to the testing apparatus, the communication module further receiving a second signal strength from the testing apparatus of signals received by the testing apparatus through the second socket;
   wherein the processor furthers outputs a first indicator of the first signal strength and a second indicator of the second signal strength for presentation on the display device.

9. The testing apparatus of claim 8, wherein:
   the processor quantifies a first data rate at the first socket based upon the first signal strength;
   the processor quantifies a second data rate at the second socket based upon the second signal strength; and
   the processor outputs the first data rate and the second data rate for presentation on the display device.

10. A method for testing a quality of a data connection between two devices communicatively coupled over an alternating-current (AC) power supply line, the method comprising:
   coupling a communication device to a first socket communicatively coupled to an AC power supply line;
   coupling a testing apparatus to a second socket communicatively coupled to the AC power supply line, wherein the testing apparatus identifies a first signal strength of signals received by the communication device through the AC power supply line and identifies a second signal strength of signals received by the testing apparatus through the AC power supply line;
   quantifying a first data rate of the first socket based upon the first signal strength;
   determining a quality of a data connection between the communication device and the testing apparatus based upon the first signal strength and the second signal strength; and outputting a quality indicator, by the testing apparatus, the quality indicator based upon by the quality of the data connection.

11. The method of claim 10, wherein outputting the indicator of the quality of the data connection further comprises:
quantifying a second data rate of the second socket based upon the second signal strength;
outputting the first data rate through the testing apparatus; and
outputting the second data rate through the testing apparatus.

12. The method of claim 11, further comprising:
determining that the second data rate is below a threshold value;
coupling the testing apparatus to a third socket communicatively coupled to the AC power supply line, wherein the testing apparatus identifies a third signal strength of signals received by the testing apparatus through the AC power supply line at the third socket;
quantifying a third data rate of the third socket based upon the third signal strength; and
outputting the third data rate through the testing apparatus.

13. The method of claim 11, further comprising:
determining that the first data rate is below a threshold value;
coupling the communication device to a third socket communicatively coupled to the AC power supply line, wherein the testing apparatus receives a third signal strength of signals received by the communication device through the AC power supply line at the third socket;
quantifying a third data rate of the third socket based upon the third signal strength; and
outputting the third data rate through the testing apparatus.

14. The method of claim 10, wherein the communication device comprises a second testing apparatus.

15. The method of claim 10, wherein the communication device comprises a television receiver.

16. A method for testing a quality of a data connection between two devices communicatively coupled over an alternating-current (AC) power supply line, the method comprising:
coupling a first testing apparatus to a first socket communicatively coupled to an AC power supply line;
identifying a first signal strength of signals received by the first testing apparatus through the AC power supply line;
coupling a second testing apparatus to a second socket communicatively coupled to the AC power supply line;
identifying a second signal strength of signals received by the second testing apparatus through the AC power supply line;
transmitting the first signal strength from the first testing apparatus to the second testing apparatus;
quantifying a first data rate of the first socket based upon the first signal strength;
quantifying a second data rate of the second socket based upon the second signal strength; and
outputting the first data rate and the second data rate through the second testing apparatus.

17. The method of claim 16, wherein outputting the first data rate and the second data rate further comprises:
outputting the first data rate through a first blinking light of the second testing apparatus; and
outputting the second data rate through a second blinking light of the second testing apparatus.

18. The method of claim 16, wherein outputting the first data rate and the second data rate further comprises:
displaying the first data rate and the second data rate on a display screen of the second testing apparatus.

19. The method of claim 16, further comprising:
determining that the first data rate is below a threshold value;
coupling the first testing apparatus to a third socket communicatively coupled to the AC power supply line, wherein the first testing apparatus identifies a third signal strength of signals received by the first testing apparatus through the AC power supply line at the third socket;
transmitting the third signal strength from the first testing apparatus to the second testing apparatus;
quantifying a third data rate of the third socket based upon the third signal strength; and
outputting the third data rate through the second testing apparatus.

20. The method of claim 16, further comprising:
determining that the second data rate is below a threshold value;
coupling the second testing apparatus to a third socket communicatively coupled to the AC power supply line, wherein the second testing apparatus identifies a third signal strength of signals received by the second testing apparatus through the AC power supply line at the third socket;
quantifying a third data rate of the third socket based upon the third signal strength; and
outputting the third data rate through the second testing apparatus.

* * * * *

UNITED STATES PATENT AND TRADEMARK OFFICE
CERTIFICATE OF CORRECTION

PATENT NO.      : 8,555,325 B2
APPLICATION NO. : 12/040471
DATED           : October 8, 2013
INVENTOR(S)     : Anthony Kozlowski et al.

It is certified that error appears in the above-identified patent and that said Letters Patent is hereby corrected as shown below:

On the Title Page

Item (56):
"Signal to noise ration, Free Online Encyclopedia, http://encyclope-dia2.thefreedictionary.com/Signal+to+noise+ratio, All pages." should read, --Signal to noise ratio, Free Online Encyclopedia, http://encyclopedia2.thefreedictionsary.com/Signal+to+noise+ratio, All pages.--.

Item (56):
"Barnard, Patrick, Asoka Unveils New BPL Network Testing Tools at CES 2008, TMCnet, January 9, 2008, http://www.tmcnet.com/ce/ar-ticles/18016-asoka-unvells-new-bpl-network-testing-tools-ces.htm (accessed on March 20, 2008)." should read, --Barnard, Patrick, Asoka Unveils New BPL Network Testing Tools at CES 2008, TMCnet, January 9, 2008, http://www.tmcnet.com/ce/articles/18016-asoka-unveils-new-bpl-network-testing-tools-ces.htm (accessed on March 20, 2008).--.

In the Claims

Column 10, Line 36:
"wherein the processor furthers outputs a first indicator of" should read, --wherein the processor further outputs a first indicator of--.

Signed and Sealed this
Twenty-ninth Day of April, 2014

Michelle K. Lee
*Deputy Director of the United States Patent and Trademark Office*